United States Patent

Sham et al.

(10) Patent No.: US 7,832,278 B2
(45) Date of Patent: Nov. 16, 2010

(54) MULTI-CHIP PACKAGE

(75) Inventors: Man Lung Ivan Sham, Shatin (HK); Ziyang Gao, Shatin (HK); Chi Kuen Vincent Leung, Shatin (HK); Lap Wai Lydia Leung, Shatin (HK); Lourdito M. Olleres, Shatin (HK); Chang Hwa Tom Chung, Shatin (HK)

(73) Assignee: Hong Kong Applied Science and Technology Research Institute Co., Ltd., Shatin, New Territories (HK)

( * ) Notice: Subject to any disclaimer, the term of this patent is extended or adjusted under 35 U.S.C. 154(b) by 14 days.

(21) Appl. No.: 12/129,429

(22) Filed: May 29, 2008

(65) Prior Publication Data

US 2009/0293604 A1 Dec. 3, 2009

(51) Int. Cl.
 *G01L 9/00* (2006.01)
(52) U.S. Cl. ........................................................ 73/754
(58) Field of Classification Search .................. None
See application file for complete search history.

(56) References Cited

U.S. PATENT DOCUMENTS

| | | | |
|---|---|---|---|
| 4,838,089 A | 6/1989 | Okada et al. | |
| 4,916,413 A | 4/1990 | Nakayama et al. | |
| 5,101,665 A | 4/1992 | Mizuno | |
| 5,327,104 A | 7/1994 | Kikushima | |
| 5,577,319 A | 11/1996 | Knecht | |
| 5,608,359 A | 3/1997 | Knecht et al. | |
| 5,859,759 A | 1/1999 | Moriyama et al. | |
| 5,948,991 A | 9/1999 | Nomura et al. | |
| 6,281,578 B1 | 8/2001 | Lo et al. | |
| 6,294,406 B1 | 9/2001 | Bertin et al. | |
| 6,534,711 B1 | 3/2003 | Pollack | |
| 6,546,982 B1 | 4/2003 | Brown et al. | |
| 6,611,434 B1 | 8/2003 | Lo et al. | |
| 6,891,239 B2 | 5/2005 | Anderson et al. | |
| 6,927,482 B1 | 8/2005 | Kim et al. | |
| 2004/0113275 A1* | 6/2004 | Karnezos | 257/758 |
| 2004/0119153 A1* | 6/2004 | Karnezos | 257/686 |
| 2004/0259288 A1* | 12/2004 | Mostafazadeh et al. | 438/106 |
| 2007/0278632 A1* | 12/2007 | Zhao et al. | 257/676 |
| 2008/0012110 A1* | 1/2008 | Chong et al. | 257/686 |
| 2008/0050859 A1* | 2/2008 | Wallace | 438/123 |
| 2008/0157311 A1* | 7/2008 | Smith | 257/678 |
| 2008/0277772 A1* | 11/2008 | Groenhuis et al. | 257/690 |
| 2008/0290486 A1* | 11/2008 | Chen et al. | 257/676 |

* cited by examiner

*Primary Examiner*—Andre J Allen
(74) *Attorney, Agent, or Firm*—Berkeley Law & Technology Group, LLP

(57) ABSTRACT

Subject matter disclosed herein may relate to packaging for multi-chip semiconductor devices as may be used, for example, in tire pressure monitoring systems.

29 Claims, 10 Drawing Sheets

MULTI-CHIP PACKAGE

FIELD

Subject matter disclosed herein may relate to packaging for multi-chip semiconductor devices as may be used, for example, in tire pressure monitoring systems.

BACKGROUND

Multi-chip semiconductor devices may comprise one or more integrated circuit dice and/or one or more other components, such as, for example, surface mount components. The various dice and/or other components may be electrically connected to each other and/or to external electrical connections by way of a leadframe, for one example. The leadframe may include pins, bumps, and/or other electrically conductive elements to permit the semiconductor device to interface with external devices and/or components. Such semiconductor devices may be housed in and/or protected by a package, such as, for example, plastic or other material encapsulating the one or more dice and/or other components. The pins, bumps, and/or other electrically conductive elements may extend through the package material to permit the one or more dice and/or other components to interface with external devices. Multi-chip semiconductor devices may be utilized in a very wide range of applications, including, for example, tire pressure monitoring systems and the like where configurability, reliability and/or durability may be key concerns.

BRIEF DESCRIPTION OF THE FIGURES

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIG. 3b is an illustration depicting a cross-sectional view of the example semiconductor device of FIG. 3a;

FIG. 3c is an illustration depicting an additional cross-sectional view of the example semiconductor device of FIG. 3a;

FIG. 5b is an illustration depicting a cross-sectional view of the example embodiment of FIG. 5a;

FIG. 6b is an illustration depicting a cross-sectional view of the example embodiment of FIG. 6a;

Figure 1:
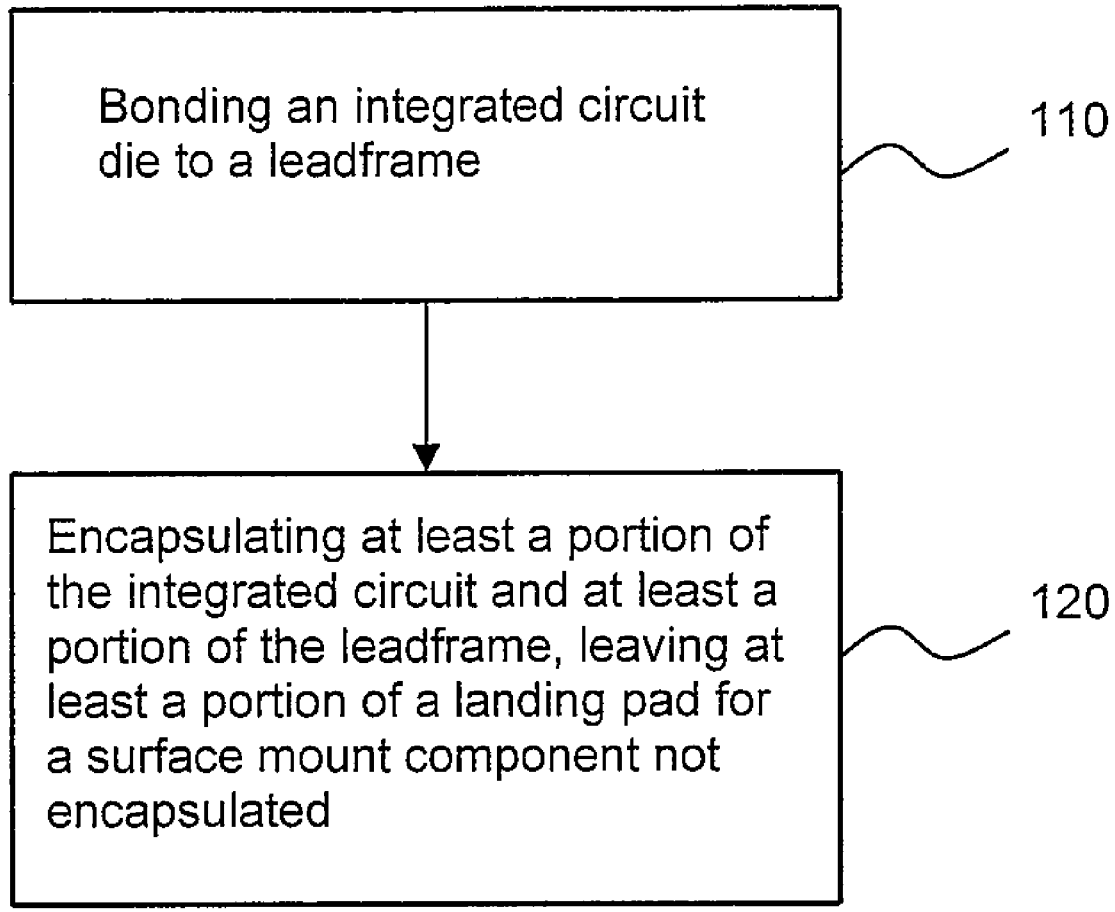
FIG. 1 is a flow diagram of an example embodiment of a method for forming a package for a multi-chip semiconductor device.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, and so on, may be used to facilitate the discussion of the drawings and are not intended to restrict the application of claimed subject matter. Therefore, the following detailed description is not to be taken in a limiting sense and the scope of claimed subject matter defined by the appended claims and their equivalents.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

Reference throughout this specification to "one embodiment" or "an embodiment" means that a particular feature, structure, or characteristic described in connection with the embodiment is included in at least one embodiment of claimed subject matter. Thus, the appearance of the phrases "in one embodiment" or "in an embodiment" in various places throughout this specification are not necessarily all referring to the same embodiment. Furthermore, the particular features, structures, or characteristics may be combined in any suitable manner in one or more embodiments.

The term "and/or" as referred to herein may mean "and", it may mean "or", it may mean "exclusive-or", it may mean "one", it may mean "some, but not all", it may mean "neither", and/or it may mean "both", although the scope of claimed subject matter is not limited in this respect.

As discussed above, multi-chip semiconductor devices may be utilized in a wide range of applications where configurability, reliability and/or durability may be key concerns. The help ensure reliability and/or durability, one or more components in a multi-chip semiconductor device may be encapsulated in a packaging material. Example materials that may be used to encapsulate the one or more components may include, but are not limited to, plastic and/or ceramic materials.

In some examples, the various components of a multi-chip semiconductor device may be interconnected in one or more examples by way of a leadframe. The leadframe may also provide electrical connections to pins and/or bumps and/or other electrically conductive elements protruding from the package, thereby permitting the semiconductor device to operate in conjunction with other devices and/or components in a larger system, for example.

In one example, a multi-chip semiconductor device may comprise an integrated circuit bonded to a leadframe and an additional component coupled to the leadframe. The integrated circuit and the additional component may both be encapsulated in plastic, for one example, with the leadframe providing electrically conductive elements protruding from the plastic to provide connectivity with other devices and/or components. For one or more examples, the additional component of the multi-chip semiconductor device may comprise a surface mount component coupled to the leadframe. For example, the surface mount component may be soldered to the leadframe prior to encapsulation.

To help ensure reliability, multi-chip semiconductor devices may undergo testing as part of a manufacturing process, for an example. However, in the examples previously described, if the components of the multi-chip semiconductor device are encapsulated, testing may be restricted to being performed via the pins and/or bumps and/or other electrically conductive elements protruding through the encapsulating material. This limitation may restrict the type and depth of testing that may be performed on the multi-chip semiconductor device.

FIG. 1 is a flow diagram of an example embodiment of a method for forming a package for a multi-chip semiconductor device. At block 110, an integrated circuit may be bonded to a leadframe, and at block 120 at least a portion of the integrated circuit and at least a portion of the leadframe may be encapsulated. For this example embodiment, the leadframe may comprise a landing pad for a surface mount component, and the encapsulation process for this example may leave at least a portion of the landing pad non-encapsulated. This partial encapsulation may provide one or more advantages over conventional techniques, such as, for example, allowing testing of the integrated circuit bonded to the leadframe prior to assembling other potentially high cost and/or high value components. Of course, this is merely an example process, and the scope of claimed subject matter is not limited in these respects.

As used herein, the term "leadframe" is meant to denote any electrically conductive structure that may be utilized to electrically interconnect two or more integrated circuit dice and/or other electronic components within a multi-chip semiconductor device. A leadframe may comprise any electrically conductive material, such as, for example, metal. Materials that may be used for a leadframe may include, but are not limited to, copper, silver, gold, and/or aluminum. Further, a "landing pad" may comprise a mounting area on a leadframe to electrically couple a surface mount component to the leadframe. The surface mount component, if installed, may be soldered to the landing pad for one or more embodiments, although the scope of claimed subject matter is not limited in this respect.

Figure 2:
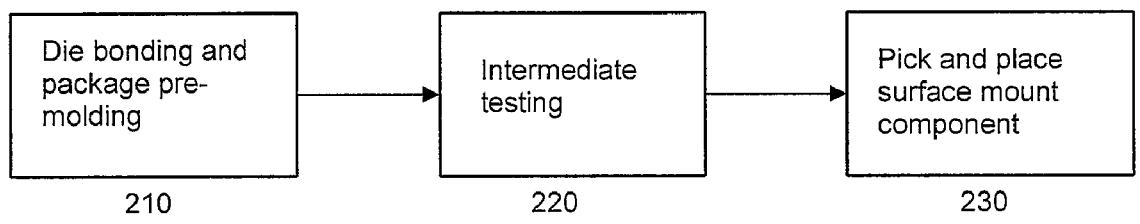
FIG. 2 is a diagram illustrating an example process for packaging and testing a multi-chip semiconductor device.

FIG. 2 is a diagram illustrating an example process for packaging and testing a multi-chip semiconductor device. Die-bonding and package pre-molding may precede an intermediate testing process, as indicated at blocks 210 and 220. Die-bonding for this example may comprise any technique, process, and/or element for coupling an integrated circuit die to a leadframe. Further, package pre-molding may, for one or more embodiments, refer to a process of partially encapsulating a semiconductor device prior to installing surface mount components on the leadframe. The pre-molding process may encapsulate at least a portion of the leadframe, and may further encapsulate one or more integrated circuit dice, but may leave one or more landing pads for surface mount components non-encapsulated. That is, the one or more landing pads may remain at least partially exposed. In this manner, a partially assembled semiconductor device may undergo types of testing that would not be possible with conventional encapsulation processes. For example, the integrated circuit bonded to the leadframe may be tested before committing to assembly of other high cost components. Further, for applications where it may be advantageous to calibrate one or more components based at least in part on which other components are included in the multi-chip device, such calibration operations may be performed during the manufacturing process before the multi-chip device becomes completely encapsulated. This may allow the multi-chip device manufacturer to perform the calibration rather than requiring assembly subcontractors to perform the calibration after the manufacturing process, for just one example advantage over conventional packaging techniques. Another possible advantage of the pre-molding example embodiments described herein may include the opportunity to test surface mount components after placement but before encapsulation, thereby allowing the reworking of surface mount components if needed.

In an embodiment, one or more surface mount components may be "picked and placed" on the one or more landing pads. The term "picked and placed" may relate to a process for selecting a surface mount component and placing the component on the landing pad. The pick-and-place process may be performed in an automated fashion using specialized machinery for one embodiment, although the scope of claimed subject matter is not limited in this respect. Also for one embodiment, following the placement of the one or more surface mount components on the landing pads, the surface mount components may be soldered to the landing pad, and the assembly of the semiconductor device may be completed. However, this is merely one example of a process for assembling a semiconductor device, and the scope of claimed subject matter is not limited in these respects.

Figure 3A:
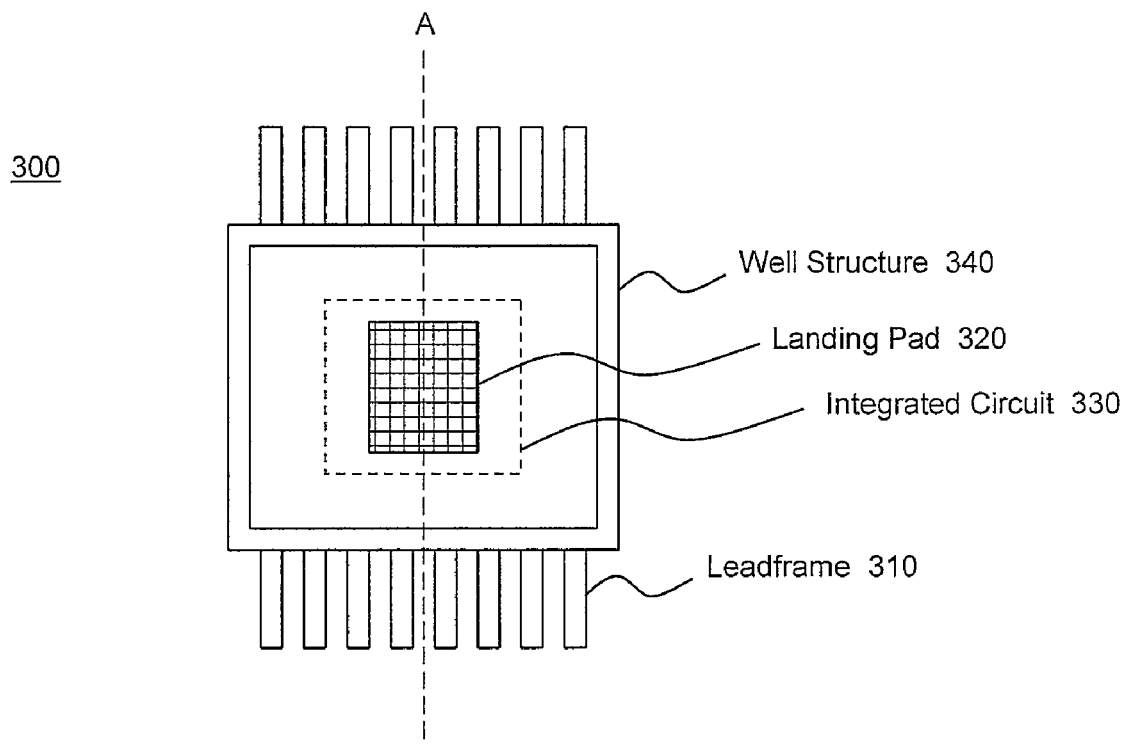
FIG. 3a is an illustration depicting a top view of an example embodiment of a multi-chip semiconductor device.
Figure 3B:
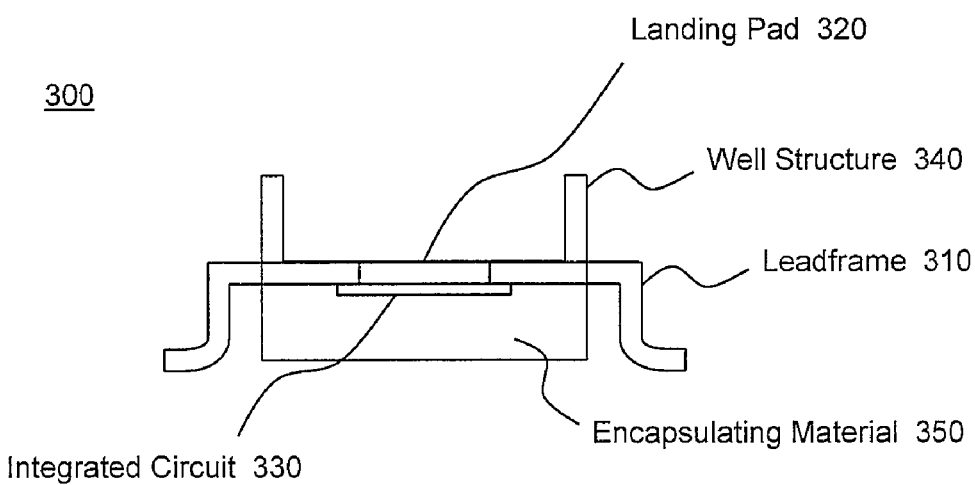

FIG. 3a is an illustration depicting a top view of an example embodiment of a multi-chip semiconductor device 300, and FIG. 3b depicts a cross-sectional view of semiconductor device 300. The cross-sectional view for this example is denoted by dotted line 'A' in FIG. 3a. Semiconductor device 300 for this example embodiment may comprise an integrated circuit 330 bonded to an underside of a leadframe 310. As used herein, the term "bonded" if used in reference to an integrated circuit die coupled to a leadframe is meant to denote any technique or material for mounting the integrated circuit die to the leadframe, and may further denote any technique for electrically connecting the integrated circuit to the leadframe, including, but not limited to, wire bonding the die to the leadframe. For this example, integrated circuit 330 is depicted by a dotted line box in FIG. 3a in order to illustrate that integrated circuit die 330 is bonded to the underside of leadframe 310, and is not visible in the top view of FIG. 3a. Further, although this example embodiment depicts a dual in-line package (as denoted by the two rows of pins extending from leadframe 310), the scope of claimed subject matter is not so limited.

A landing pad 320 is also depicted in FIGS. 3a and 3b. As described previously, a landing pad generally may comprise a surface area on a leadframe capable of receiving a surface mount electronic component. For this example, landing pad 320 comprises a surface area of leadframe 310. Landing pad 320 may provide electrical contact points for a surface mount component to be placed on the landing pad. For one example, the surface mount component to be placed may comprise a number of solder balls and/or solder paste and/or solder bumps on the bottom side of the component, and the solder balls and/or solder paste and/or solder bumps may make contact with the electrical contact points of the landing pad, thereby electrically connecting the surface mount component to the lead frame, and in turn to one or more devices and/or components external to semiconductor device 300. In the example depicted in FIGS. 3a and 3b, a surface mount component had not yet been placed on landing pad 320.

In FIG. 3b, it may be seen that semiconductor device 300 may comprise an encapsulating material 350. For one example embodiment, encapsulating material 350 may approximately fully encapsulate integrated circuit 330, and may partially encapsulate leadframe 310. Also for this example, landing pad 320 remains not encapsulated in order to allow the eventual placement of the surface mount component. Further, for an example embodiment, encapsulating material 350 may form a well structure 340 surrounding the periphery of semiconductor device 300, as depicted in FIGS. 3a and 3b. Well structure 340 may provide a dam structure that may hold an eventual fill material that may encapsulate landing 320 pad and the surface mount component following the placement of the surface mount component and following any testing that may be advantageously performed prior to filling well structure 340.

Examples of the types of testing that may be performed on semiconductor device 300 prior to placing the surface mount component and prior to filling in well structure 340 may include, but are not limited to, testing integrated circuit 330 using exposed input/output pads and/or contact points made available via leadframe 310. In this manner, testing may not be restricted to signals presented to the pins and/or balls and/or other electrically conductive elements protruding from encapsulating material 350, but rather the testing may take advantage of a wider range of possible contact points on leadframe 310.

Further, if the surface mount component is placed and soldered on landing pad 320, and if well structure 340 has not yet been filled, testing may be performed to ensure proper connection between the surface mount component and leadframe 310. Similarly, the function of the surface mount component may also be tested. These types of tests would not normally be possible with conventional encapsulation processes, but may be utilized as an advantage of one or more encapsulation techniques described herein.

For one or more embodiments, encapsulating material 350 may comprise a plastic material, and the encapsulation of integrated circuit 330 and the formation of well structure 340 may be performed using a mold-transfer process. However, this is merely an example of a process and/or technique for encapsulating an integrated circuit and/or forming a well structure, and the scope of claimed subject matter is not limited in this respect.

Figure 3C:
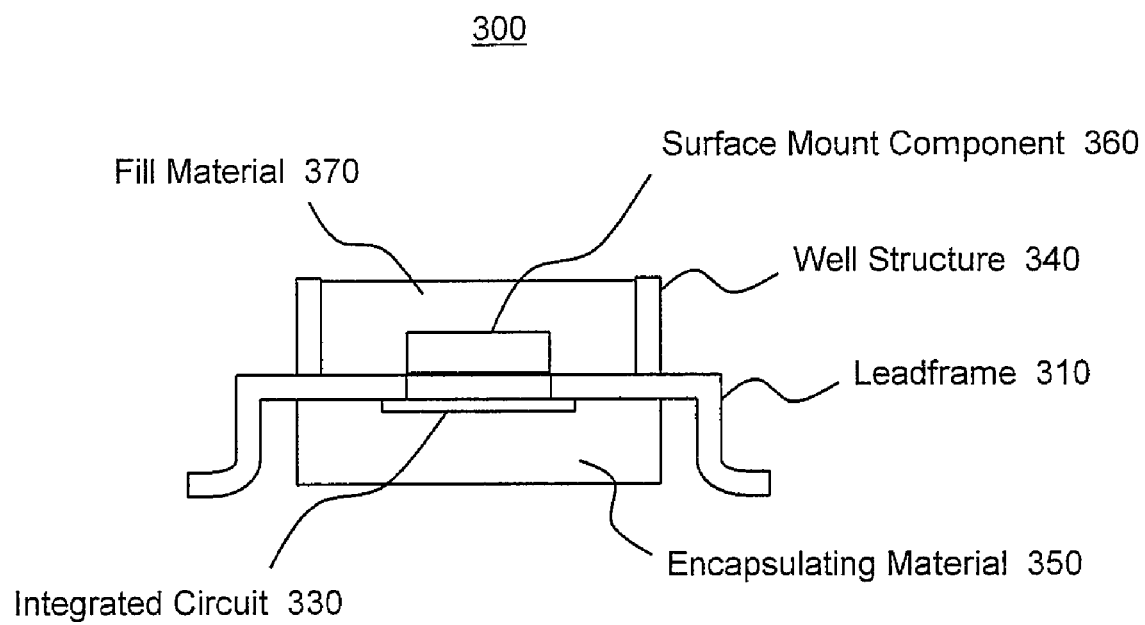

FIG. 3c is an illustration depicting an additional cross-sectional view of example semiconductor device 300. In this figure, a surface mount component 360 is depicted mounted on landing pad 320. A fill material 370 is depicted as filling in well structure 340, thereby encapsulating surface mount component 360 and landing pad 320. For one embodiment, fill material 370 may comprise an epoxy material, although the scope of claimed subject matter is not limited in this respect. Fill material 370 may serve to reinforce the structural integrity of device 300, and may serve to protect surface mount component 360, thereby offering potentially improved reliability and/or durability. Thus, the example embodiments described herein provide for improved testing of various components and sub-systems, and may also provide improved reliability and/or durability.

Figure 4:
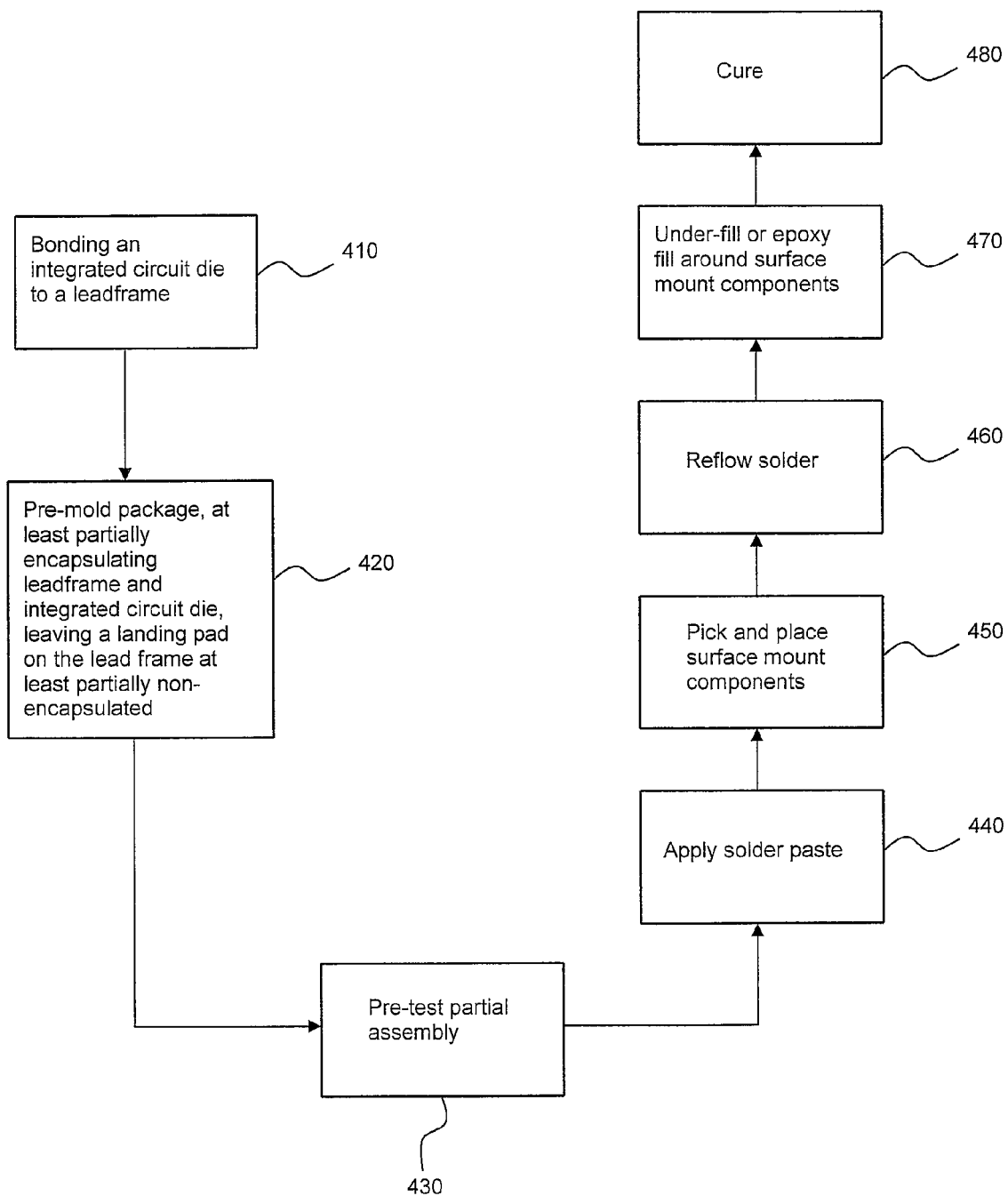
FIG. 4 is a flow diagram of an example embodiment of a method for packaging and testing a multi-chip semiconductor device.

FIG. 4 is a flow diagram of an example embodiment of a method for packaging and testing a semiconductor device. At block 410, an integrated circuit die may be bonded to a leadframe, and at block 420, a semiconductor package may be pre-molded. The pre-molding process may at least partially encapsulate the leadframe and the integrated circuit die, and may leave a landing pad on the leadframe at least partially non-encapsulated.

For this example embodiment, following the pre-molding process, pre-testing may be performed on the partial assembly. As described above in connection with FIGS. 3a-3c, such testing may include, but is not limited to, testing connections between the integrated circuit die and the leadframe, and may also include testing the integrated circuit by accessing signals that would not otherwise be available external to the semiconductor device.

Also for this example embodiment, solder paste may be applied for example to the landing pad in preparation for the "pick and place" of a surface mount component, depicted at block 450. At block 460, a solder reflow process may be performed, thereby forming one or more solder connections between the surface mount component and the landing pad 320. To reinforce the bond between the landing pad and the integrated circuit die, in an embodiment, an "under-fill" layer of epoxy material may be injected or otherwise inserted between the landing pad and the surface mount component. In another embodiment, a pre-molded well structure may be filled in with an epoxy material, thereby encapsulating the surface mount component and the landing pad. For the under-fill embodiments and/or the well-structure fill embodiments, for example, the epoxy material may be cured at block 480. Embodiments in accordance with claimed subject matter may include all, more than all, or less than all of blocks 410-480. Further, the order of blocks 410-480 in merely an example order, and the scope of claimed subject matter is not limited in this respect.

Figure 5A:
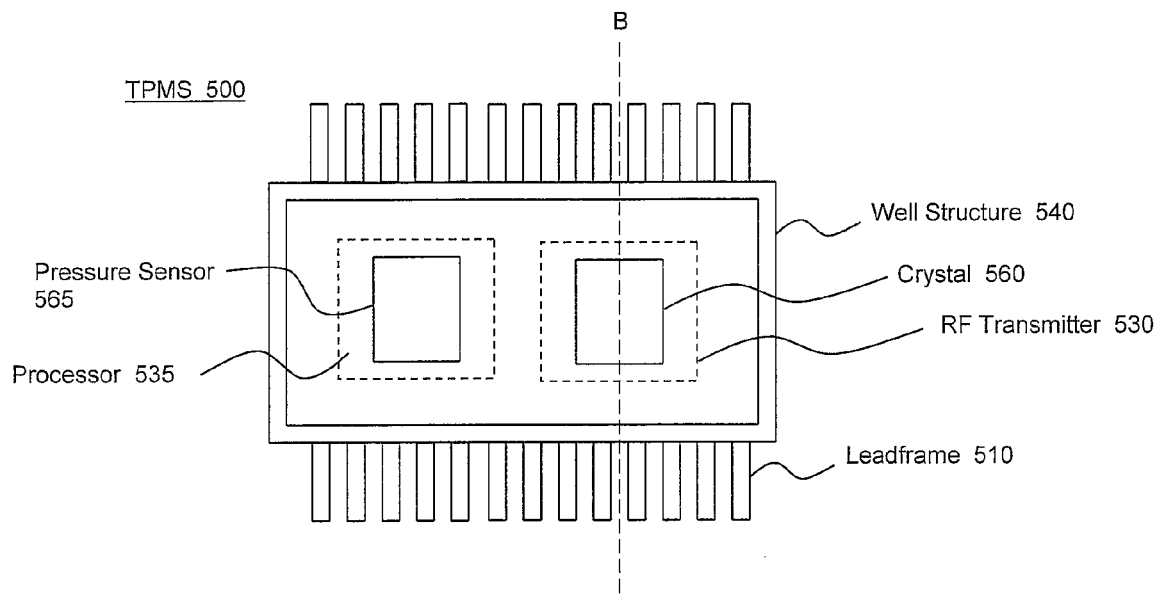
FIG. 5a is an illustration depicting a top view of an example embodiment of a tire pressure monitoring system module.
Figure 5B:
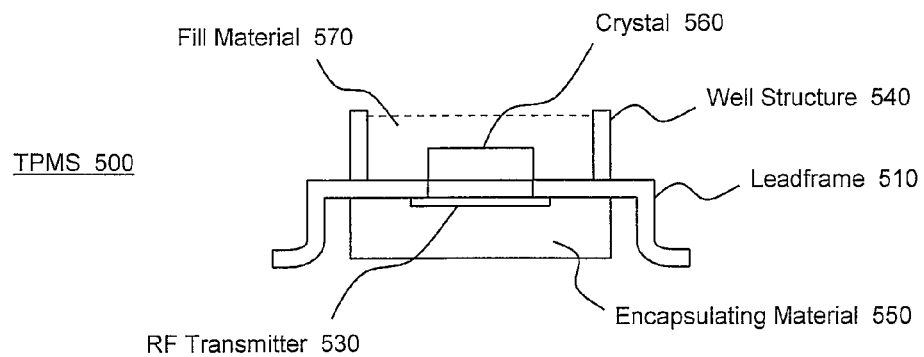

FIG. 5a is an illustration depicting a top view of an example embodiment of a multi-chip semiconductor device which, for this example, comprises a tire pressure monitoring system (TPMS) module 500, and FIG. 5b is an illustration depicting a cross-section of TPMS module 500, wherein the cross-section is denoted by dotted line 'B' in FIG. 5a. For one or more embodiments, a TPMS module may be mounted on an automotive wheel and may be positioned on the wheel in such a way so as to be exposed to the air pressure inside of a tire mounted on the wheel, further described below.

Due to harsh conditions that may exist inside of an automotive tire, the reliability and/or durability of a TPMS module may be an important issue. Therefore, it may be advantageous to package TPMS modules in accordance with the example embodiments described above in connection with FIGS. 1-4.

TPMS module 500 for this example embodiment may comprise a radio frequency (RF) transmitter 530 bonded to an underside of a leadframe 510. TPMS 500 further comprises a processor 535 also bonded to the underside of leadframe 510. For this example, RF transmitter 530 and processor 535 comprise integrated circuits, each comprising one or more integrated circuit dice. Also for this example, RF transmitter 530 and processor 535 are depicted by dotted line boxes in FIG. 5a in order to illustrate that the integrated circuit RF transmitter 530 and processor 535 are bonded to the underside of leadframe 510, and are not visible in the top view of FIG. 5a. Further, although this example embodiment depicts a dual in-line package (as denoted by the two rows of pins extending from leadframe 510), the scope of claimed subject matter is not limited in this respect.

TPMS 500 further comprises a crystal oscillator component 560 and a pressure sensor 565. For this example embodiment, crystal 560 and pressure sensor 565 comprise surface mount components that, for this example, may be mounted to one or more landing pads on leadframe 510. For one or more embodiments, RF transmitter 530 may be programmable and/or otherwise configurable to permit operation according to any of various frequency standards in various countries, for example. Thus, TPMS module 500 may be readily programmed to operate in any of a number of jurisdictions, significantly reducing the cost of providing a range of solutions suitable for various markets around the world.

For one or more embodiments, pressure sensor 565 may comprise a bare die. In one or more other embodiments, pressure sensor 565 may comprise a packaged component. In either case, the pressure sensor may be electrically coupled to leadframe 510 via a landing pad. Note that as used herein, the term "surface mount component" is meant to comprise bare die components and/or packaged components.

Also, for one or more embodiments, crystal 560 may comprise a bulk quartz crystal. In one or more other embodiments, crystal 560 may comprise a micro-electro-mechanical system (MEMS) based die. Of course, these are merely example crystal types, and the scope of claimed subject matter is not limited in this respect.

In FIG. 5b, it may be seen that TPMS 500 may comprise an encapsulating material 550, as well as a fill material 570. For one example embodiment, encapsulating material 550 may approximately fully encapsulate RF transmitter 530 and processor 535, and may partially encapsulate leadframe 510. Further, for an example embodiment, encapsulating material 550 may form a well structure 540 surrounding the periphery of TPMS 500, as depicted in FIGS. 5a and 5b.

For an example embodiment, fill material 570 may encapsulate crystal 560 and pressure sensor 565. As with previously described examples, prior to filling well structure 540, testing may be performed on the partial assembly consisting of leadframe 510, integrated circuits 530 and 530, and encapsulation material 550, although the scope of claimed subject matter is not limited in these respects.

For one or more embodiments, encapsulating material 550 may comprise a plastic material, and the encapsulation of integrated circuit 530 and 535 and the formation of well structure 540 may be performed using a mold-transfer process. However, this is merely an example of a process and/or technique for encapsulating an integrated circuit and/or forming a well structure, and the scope of claimed subject matter is not limited in this respect.

For one embodiment, fill material 570 may comprise an epoxy material, although the scope of claimed subject matter is not limited in this respect. Fill material 570 may serve to reinforce the structural integrity of TPMS 500, and may serve to protect crystal 560 and pressure sensor 565, thereby offering potentially improved reliability and/or durability. Thus, the example embodiments described herein provide for improved testing of various components and sub-systems, and may also provide improved reliability and/or durability. In this manner, a partially assembled semiconductor device may undergo types of testing that would not be possible with conventional encapsulation processes. For example, processor 535 and RF transmitter 530 may be tested before committing to assembly of other high cost components, such as, for example, pressure sensor 565 and crystal 560. Further, the embodiments described herein may provide increased flexibility for accommodating various types of calibrated pressure sensors, for example, which may remove the burden of calibration from system assembly sub-contractors. Another previously mentioned possible advantage of the pre-molding example embodiments described herein may include the opportunity to test surface mount components after placement but before encapsulation, thereby allowing the reworking of surface mount components if needed.

Although this example embodiment describes pressure sensor 565, the pressure sensor is merely an example sensor type, and the scope of claimed subject matter is not limited in this respect. Further, processor 535 may comprise any of a wide range of devices capable of executing instructions, including, by way of non-limiting example, a microcontroller.

As previously mentioned, TPMS module 500 may comprise RF transmitter 530. RF transmitter 530 for this example embodiment may transmit sensor information to a remote receiver. In the case of a tire pressure monitoring system, module 500 may be mounted to a wheel in a position to sense air pressure within a tire mounted to the wheel. Information gathered from measurements taken by sensor 565 may be processed by processor 535 and/or may be transmitted to the remote receiver that, for one or more embodiment, may be located outside of the tire.

In an embodiment, processor 535 may be capable of executing instructions that may direct the processor to perform various functions associated with tire pressure monitoring systems. Of course, this is merely an example of the type of instructions that may be executed by processor 535, and the scope of claimed subject matter is not limited in these respects. Instructions for processor 535 may be stored, for one or more embodiments, in a machine readable medium, although again, the scope of claimed subject matter is not so limited. In an embodiment, the instructions may be stored in a non-volatile storage device (not shown) on module 500.

Although example TPMS module 500 is depicted in FIGS. 5a and 5b as having a particular composition and arrangement of components, a wide range of other embodiments are possible using any of a wide range of components and/or arrangements, for a wide range of possible applications. The tire pressure monitoring system described herein is merely an example system, and the scope of claimed subject matter is not limited in this respect.

By integrating pressure sensor 565 and crystal 560 in a single package, a complete TPMS module solution may be provided, and TPMS product manufacturers may not need to calibrate the sensor and/or crystal, as those steps, if needed, may be performed during manufacturing, as described above, for example. This may result in cost savings as well as a quicker time-to-market. Further, by integrating the crystal in the same package as the sensor, at least one component may be reduced from the TPMS system. Whereas previously a separate crystal was required, with the embodiments described herein the crystal may be integrated with the sensor. Further, by integrating the crystal and sensor in the same package as described above, reliability of the pressure sensor and crystal sub-system may be improved. Additionally, the integration of the crystal with the pressure sensor may result in a reduced real-estate area of a TPMS system substrate. These advantages may also be realized with the example embodiments described below in connection with FIGS. 6a-6b.

Figure 5C:
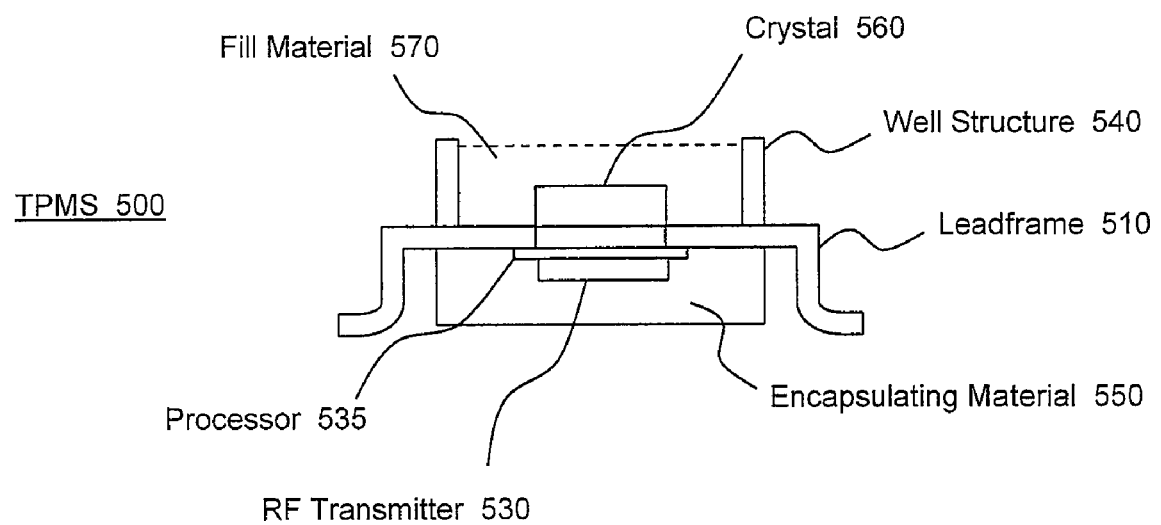
FIG. 5c is an illustration depicting a cross-sectional view of an alternate example embodiment.

FIG. 5c illustrates another embodiment of a TPMS module 500. For this example embodiment, RF transmitter 530 may be stacked onto processor 535. Electrical connections may be made between processor 535 and RF transmitter 530 to permit RF transmitter to communicate with processor 535. In other embodiments, electrical leads may couple RF transmitter 530 to leadframe 510, although the scope of claimed subject matter is not limited in this respect. Also, although this example embodiment depicts an RF transmitter stacked with a processor, the scope of claimed subject matter is not limited in this respect, and other embodiments are possible with other types of components stacked together.

Figure 6A:
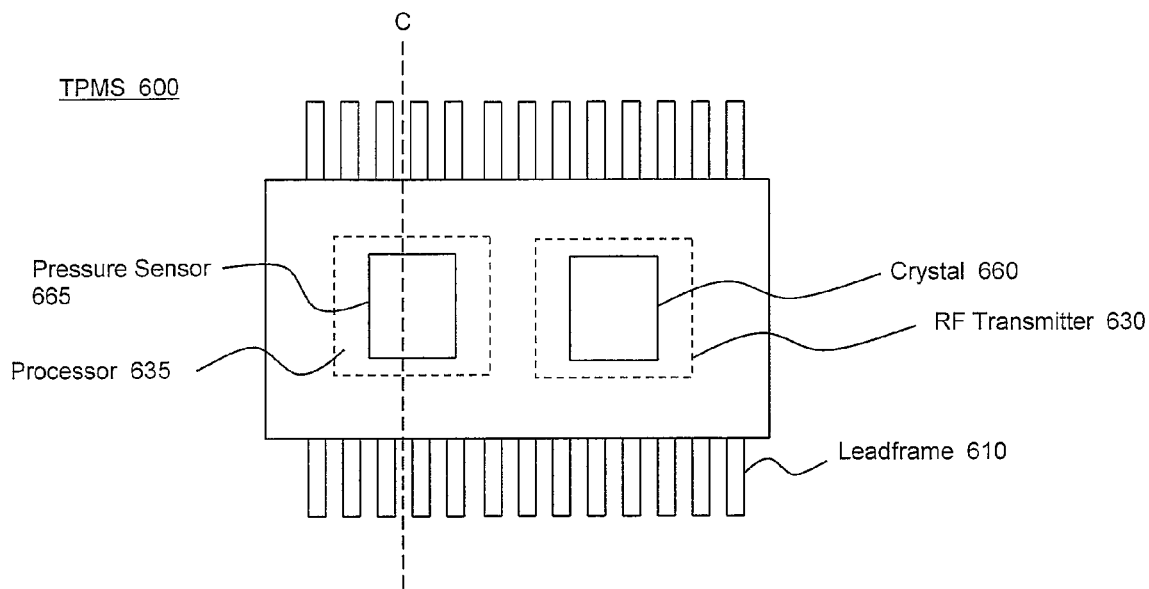
FIG. 6a is an illustration depicting a top view of an additional example embodiment of a tire pressure monitoring system module.
Figure 6B:
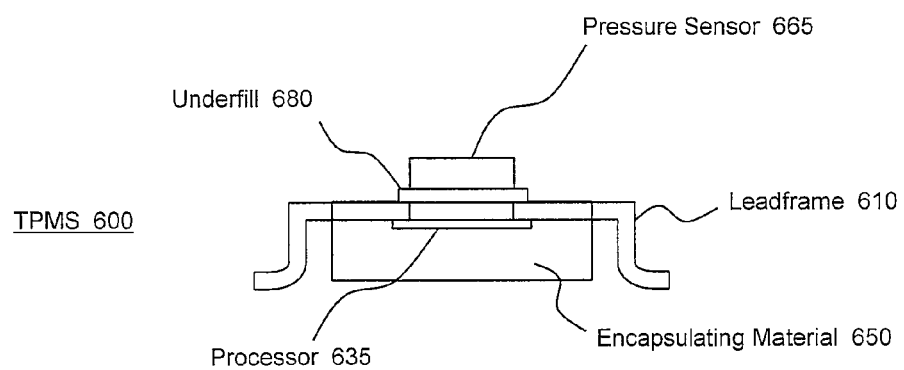

FIG. 6a is an illustration depicting a top view of an additional example embodiment of a TPMS module 600, and FIG. 6b depicts a cross-sectional view of the example embodiment of FIG. 6a. The cross-sectional view of FIG. 6b is denoted by dotted line 'C' of FIG. 6a. For this example embodiment, TPMS module 600 may share many characteristics with TPMS module 500, described above. For example, TPMS module 600 may comprise a crystal 660 and a pressure sensor 665, each of which perhaps comprising a surface mount component, for an example. Crystal 660 and pressure sensor 665 may be mounted to landing pads on a leadframe 610. Also, TPMS module 600 may comprise a processor 635 and an RF transmitter 630. Processor 635 and RF transmitter 630 may comprise one or more integrated circuit dice bonded to the underside of leadframe 610. Further, TPMS module 600 may comprise an encapsulating material 650 that may encapsulate, at least in part, processor 635, RF transmitter 630, and leadframe 610. As with previously described examples, at least a portion of leadframe 610 may remain non-encapsulated, thereby allowing later placement of surface mount components on one or more exposed landing pads of leadframe 610.

However, note that for TPMS 600, there is no well structure such as structure 540 depicted in FIG. 5a, for example. Rather, an underfill layer 680 of epoxy or other material may be injected or otherwise introduced between pressure sensor 665 and its landing pad on leadframe 610, and also between crystal 660 and its landing pad, also on leadframe 610.

As with previously discussed example embodiments, if surface mount components are not yet placed, testing procedures may be performed that would not ordinarily be available with conventional encapsulation processes. For an example embodiment, underfill layer 680 may be formed at least in part in response to completion of the aforementioned testing procedures, although the scope of claimed subject matter is not limited in this respect.

For one or more embodiments, encapsulating material 650 may comprise a plastic material, and the encapsulation of integrated circuits 630 and 635 and the partial encapsulation of leadframe 610 may be performed using a mold-transfer process. However, this is merely an example of a process and/or technique for encapsulating an integrated circuit, and the scope of claimed subject matter is not limited in this respect.

For one embodiment, underfill layer 680 may comprise an epoxy material, although the scope of claimed subject matter is not limited in this respect. Underfill layer 680 may serve to reinforce the structural integrity of TPMS 600, and may serve to protect crystal 660 and pressure sensor 665, thereby offering potentially improved reliability and/or durability. Thus, the example embodiments described herein provide for improved testing of various components and sub-systems, and may also provide improved reliability and/or durability.

Although this example embodiment depicts a small outline package (SOP), as denoted by the two rows of pins extending from leadframe 610, the scope of claimed subject matter is not limited in this respect. Further, although the above examples describe a tire pressure monitoring system, the scope of claimed subject matter is not limited in this respect, and multi-chip semiconductor devices in accordance with claimed subject matter are possible for any of a very wide range of applications.

Figure 6C:
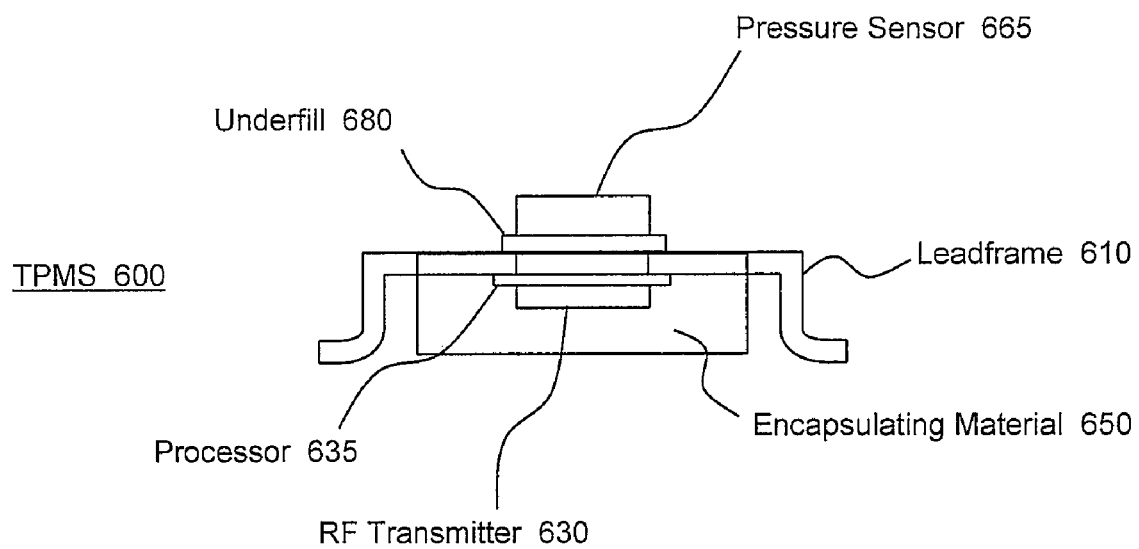
FIG. 6c is an illustration depicting a cross-sectional view of an alternate example embodiment.

FIG. 6c illustrates another embodiment of a TPMS module 600. For this example embodiment, RF transmitter 630 may be stacked onto processor 635. Electrical connections may be made between processor 635 and RF transmitter 630 to permit the RF transmitter to communicate with processor 635. In other embodiments, electrical leads may couple RF transmitter 630 to leadframe 610, although the scope of claimed subject matter is not limited in this respect. Also, although this example embodiment depicts an RF transmitter stacked with a processor, the scope of claimed subject matter is not limited in this respect, and other embodiments are possible with other types of components stacked together.

Figure 7:
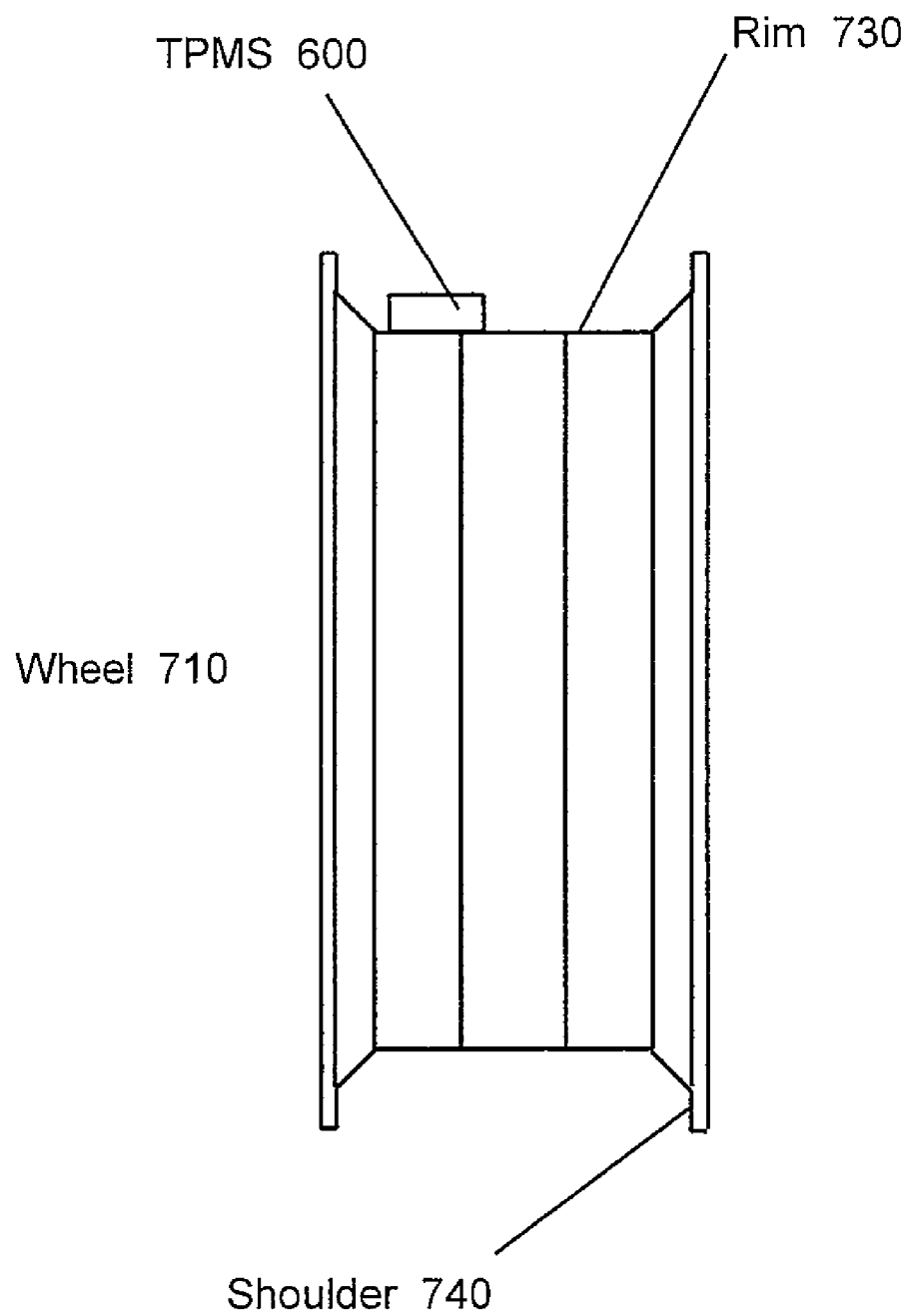
FIG. 7 is an illustration depicting an example embodiment of a tire pressure monitoring system module mounted to an automobile wheel.

FIG. 7 is an illustration depicting an example embodiment of TPMS module 600 mounted to an automobile wheel 710, wherein wheel 710 comprises a rim 730 and a shoulder 740. For this example embodiment, TPMS module 600 may comprise an example sensor module embodiment such as discussed above, for example, in connection with FIGS. 5a-6b, accompanied with other components, such as, for example, a battery, an antenna, etc. For this example embodiment, TPMS module 600 may be fixed to rim 730, and a tire (not shown so to not obscure the embodiment) may be mounted to the rim, with shoulder 740 providing a seal between wheel 710 and the tire. During operation, TPMS module 600 may rotate with wheel 710. TPMS module 600 may continually or periodically measure air pressure in the tire, and may transmit measurement information to a receiver located somewhere outside of the tire such as, for example, inside of the driving compartment. TPMS module 600 is merely one example of an application that may benefit from the packaging and/or encapsulation embodiments described herein. As previously mentioned, multi-chip semiconductor devices in accordance with one or more embodiments described herein may find utility in any of a wide range of applications.

Further, although the example embodiments of multi-chip semiconductor devices described herein utilize small outline packages (SOP), the example embodiments described herein may be practiced with any of a wide range of package types. For example, other package types that may advantageously utilize embodiments in accordance with claimed subject matter may include, but are not limited to, dual in-line package (DIP), System In Package (SIP), Quad Flat No-Lead (QFN), Ball Grid Array (BGA), etc.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

What is claimed is:

1. A semiconductor device, comprising:
    a leadframe comprising a first side and a second side, wherein the second side comprises a first landing pad for a surface mount component;
    a first integrated circuit die bonded to the first side of the leadframe; and
    a package to encapsulate at least a portion of the first integrated circuit and at least a portion of the leadframe, wherein at least a portion of the first landing pad is not encapsulated by the package.

2. The semiconductor device of claim 1, further comprising a first surface mount component bonded to the first landing pad.

3. The semiconductor device of claim 2, further comprising a polymer layer formed substantially between the first surface mount component and the leadframe.

4. The semiconductor device of claim 2, wherein the package comprises a well structure surrounding the first landing pad.

5. The semiconductor device of claim 4, further comprising a material to substantially fill the well structure, the material to encapsulate, at least in part, the first surface mount component.

6. The semiconductor device of claim 5, wherein the material to substantially fill the well structure comprises a polymer.

7. The semiconductor device of claim 2, wherein the first surface mount component comprises a pressure sensor.

8. The semiconductor device of claim 7, wherein the first integrated circuit die comprises a processor.

9. The semiconductor device of claim 8, wherein the second side of the leadframe further comprises a second landing pad for a surface mount component.

10. The semiconductor device of claim 9, further comprising:
   a second integrated circuit die bonded to the first side of the leadframe; and
   a second surface mount component bonded to the second landing pad, the package to encapsulate at least a portion of the second integrated circuit and the package to not encapsulate at least a portion of the second surface mount component.

11. The semiconductor device of claim 10, wherein the second integrated circuit die comprises a radio frequency transmitter and wherein the second surface mount component comprises an oscillator.

12. A method, comprising:
   forming a first landing pad for a surface mount component on a first side of a leadframe;
   bonding a first integrated circuit die to a second side of the leadframe; and
   encapsulating with a first material at least a portion of the first integrated circuit die and at least a portion of the leadframe leaving the first landing pad substantially not encapsulated.

13. The method of claim 12, further comprising wire-bonding the first integrated circuit die to the leadframe.

14. The method of claim 12, wherein said encapsulating comprises a transfer molding technique.

15. The method of claim 14, wherein said encapsulating comprises forming a well structure surrounding the first landing pad.

16. The method of claim 14, further comprising applying a solder paste to at least a portion of the first landing pad.

17. The method of claim 16, further comprising:
   placing a first surface mount component on the first landing pad; and
   reflowing the solder paste to establish one or more electrical connections between the first surface mount component and the leadframe.

18. The method of claim 17, further comprising forming an epoxy layer between the first surface mount component and the leadframe.

19. A semiconductor device, comprising:
   means for providing electrical connections comprising a first side and a second side, wherein said second side comprises a first landing pad for a surface mount component;
   a first integrated circuit die bonded to the first side of the means for providing electrical connections; and
   means for encapsulating at least a portion of the first integrated circuit die and at least a portion of the means for providing electrical connections, wherein at least a portion of the first landing pad is not encapsulated.

20. The semiconductor device of claim 19, further comprising a first surface mount component bonded to the first landing pad.

21. The semiconductor device of claim 20, further comprising means for reinforcing the bond between the first surface mount component and the first landing pad.

22. The semiconductor device of claim 20, wherein said means for encapsulating comprises a well structure surrounding at least a portion of the second side of the means for providing electrical connections.

23. The semiconductor device of claim 22, further comprising means for substantially filling the well structure, said means for substantially filling the well structure to encapsulate, at least in part, the first surface mount component.

24. The semiconductor device of claim 20, wherein the first surface mount component comprises a pressure sensor.

25. The semiconductor device of claim 24, wherein the first integrated circuit die comprises a processor.

26. The semiconductor device of claim 25, further comprising:
   a second integrated circuit die bonded to the first side of the means for providing electrical connections, the second side of the means for providing electrical connections further comprising a second landing pad for a surface mount component; and
   a second surface mount component bonded to the second landing pad, said means for encapsulating to encapsulate at least a portion of the second integrated circuit die and to not encapsulate at least a portion of the second surface mount component.

27. The semiconductor device of claim 26, wherein the second integrated circuit die comprises a radio frequency transmitter and wherein the second surface mount component comprises an oscillator.

28. The semiconductor device of claim 26, wherein the second integrated circuit die comprises a radio frequency transmitter bonded to the first side of the means for providing electrical connections.

29. The semiconductor device of claim 19, further comprising a radio frequency transmitter, wherein the first integrated circuit die comprises a processor, and wherein the radio frequency transmitter is stacked onto the processor.

* * * * *